United States Patent [19]

Berner

[11] 4,284,485

[45] Aug. 18, 1981

[54] PHOTOCURABLE COMPOSITIONS

[75] Inventor: Godwin Berner, Basel, Switzerland

[73] Assignee: Ciba-Geigy Corporation, Ardsley, N.Y.

[21] Appl. No.: 54,770

[22] Filed: Jul. 5, 1979

[30] Foreign Application Priority Data

Jul. 13, 1978 [CH] Switzerland ............. 7622/78

[51] Int. Cl.³ ............. C08F 4/00; C08F 2/50
[52] U.S. Cl. ............. 204/159.15; 204/159.16; 204/159.18; 204/159.19; 204/159.23; 204/159.24; 260/45.9 R
[58] Field of Search ............. 204/159.23, 159.18, 204/159.15; 260/45.9 R

[56] References Cited

U.S. PATENT DOCUMENTS

| | | | |
|---|---|---|---|
| 3,639,321 | 2/1972 | Krefeld et al. | 260/28.5 |
| 3,982,942 | 9/1976 | Lu | 204/159.15 |
| 4,048,034 | 9/1977 | Martan | 204/159.23 |
| 4,089,762 | 5/1978 | Fordsham | 204/159.15 |
| 4,139,520 | 2/1979 | Ramey et al. | 260/45.95 R |
| 4,169,167 | 9/1979 | McDowell | 204/159.23 |
| 4,201,642 | 5/1980 | Nowak | 204/159.15 |

FOREIGN PATENT DOCUMENTS 1694253 3/1968 Fed. Rep. of Germany .
1694149 10/1969 Fed. Rep. of Germany .
49-104989 4/1974 Japan ............. 204/159.15

Primary Examiner—Wilbert J. Briggs, Sr.
Attorney, Agent, or Firm—Harry Falber

[57] ABSTRACT

The use of photo-initiators of the formula I or II

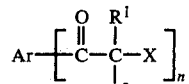

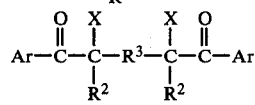

in which n is 1 or 2, Ar is a monovalent or divalent aromatic radical, X is a tertiary amino group, a hydroxyl or ether group or a siloxy group, $R^1$ and $R^2$ are alkyl, substituted alkyl, alkenyl, cycloalkyl or phenylalkyl or together are alkylene or oxa- or aza-alkylene and $R^3$ is a direct bond or a divalent aliphatic, cycloaliphatic or aromatic radical, in combination with light stabilizers from the category of the polyalkylpiperidine derivatives in the photopolymerization of ethylenically unsaturated compounds results in polymers with high stability to light and low yellowing.

8 Claims, No Drawings

PHOTOCURABLE COMPOSITIONS

The invention relates to photocurable compositions of one or more photocurable, ethylenically unsaturated compounds, a photo-initiator and a light stabiliser, which can also contain other conventional additives if desired.

It is known that the photopolymerisation of ethylenically unsaturated compounds can be considerably accelerated by the addition of photo-initiators. This is of decisive importance for the industrial application of photopolymerisation reactions, for example for lacquers, coatings, moulding compositions or print pastes. Various categories of organic compounds have been disclosed as photocuring agents, for example derivatives of benzophenone, of benzoin, of acetophenone or of benzil. Aromatic-aliphatic ketones which are substituted in the aliphatic radical by hydroxyl, alkoxy, silyloxy or amino groups have been proposed as photo-initiators in German Offenlegungsschrift No. 2,722,264 and in European Pat. Application No. 788,100 31.1 now E.P. Publication No. 3002.

For specific applications of photopolymerisation there is a need to protect the cured compositions against yellowing or degradation by the action of light. This applies in particular in the case of use for unpigmented coatings and moulding compositions, for example in the case of clear lacquers, coatings on wood or fibreboard sheets, coatings on plastics or coatings on printed paper and cardboard articles.

The obvious solution to the problem would be the addition of light stabilisers, such as are customary for stabilising plastics and lacquers. Such solutions have already been proposed, for example the combination of benzoin ethers as photo-initiators with UV absorbers as light stabilisers is proposed in German Offenlegungsschrift 1,694,253. These UV absorbers have the disadvantage that they retard the photopolymerisation due to their absorption in the UV. The acceleration of the photopolymerisation achieved by the addition of a photo-initiator is thus partially eliminated again by the UV absorber used, in particular if the UV absorber is used in an amount of more than 0.3%.

An advance can be achieved if light stabilisers from the category of the polyalkylpiperidine derivatives are used in place of the UV absorbers. These derivatives do not retard the rate of curing, even if they are used in amounts of 1–2%. However, the piperidine derivatives have the disadvantage that with most photo-initiators they produce yellowing of the polymerised composition after UV curing.

Surprisingly, it has now been found that such yellowing due to piperidine light stabilisers takes place to a substantially lesser extent if very specific compounds are used as the photo-initiators. The invention therefore relates to photocurable compositions consisting of (a) one or more ethylenically unsaturated, photocurable compounds, (b) at least one photo-initiator of the formula I or II

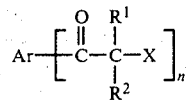

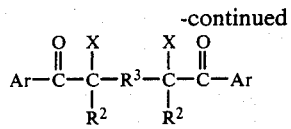

in which n is 1 or 2 and, if n is 1, Ar is unsubstituted phenyl or phenyl substituted by one or more of the radicals F, Cl, Br, $C_1$–$C_{12}$ alkyl, —OAlk, phenyl, —Ophenyl, —SAlk, —SCH$_2$CH$_2$OH or —Sphenyl, or indanyl or tetrahydronaphthyl, and Alk is a lower alkyl radical having 1–4 C atoms, and if n is 2 Ar is $C_6$–$C_{12}$ arylene or a group -phenylene-T-phenylene-, in which T is —O—, —S—, —CH$_2$— or —CH$_2$CH$_2$—, X is one of the groups —NR$^4$R$^5$, —OR$^6$ or —OSiR$^7$(R$^8$)$_2$, R$^1$ is unsubstituted $C_1$–$C_8$ alkyl or $C_1$–$C_8$ alkyl substituted by —OH, OAlk, $C_2$–$C_8$ acyloxy, —NR$^4$R$^5$, —COOAlk or —CN, or $C_3$–$C_4$ alkenyl, $C_5$–$C_6$ cycloalkyl or $C_7$–$C_9$ phenylalkyl, R$^2$ has one of the meanings defined for R$^1$ or together with R$^1$ is $C_2$–$C_8$ alkylene or $C_3$–$C_9$ oxa- or aza-alkylene, R$^3$ is a direct bond, $C_1$–$C_6$ alkylene, $C_2$–$C_6$ oxa-alkylene, $C_2$–$C_6$ thia-, S-oxothia- or S-dioxothia-alkylene, phenylene, diphenylene or a group -phenylene-T-phenylene-, or together with the two substituents R$^2$ and the two C atoms to which these substituents are bonded forms a cyclopentane, cyclohexene, endomethylenecyclohexane or cyclohexane ring, R$^4$ is $C_1$–$C_{12}$ alkyl or $C_2$–$C_4$ alkyl which is substituted by —OH or OAlk, R$^5$ is $C_1$–$C_{12}$ alkyl or $C_2$–$C_4$ alkyl which is substituted by OH or OAlk, or together with R$^4$ is $C_4$–$C_5$ alkylene, which can be interrupted by —O— or —NR$^9$—, R$^6$ is hydrogen, $C_1$–$C_{12}$ alkyl, $C_1$–$C_8$ alkyl substituted by Cl, Br, OH, OAlk, SAlk, $C_2$–$C_8$ acyloxy, —COOAlk, —CONHAlk, —CON(Alk)$_2$ or CN, or $C_3$–$C_5$ alkenyl, cyclohexyl, benzyl, unsubstituted phenyl or phenyl substituted by Cl or Alk, or 2-tetrahydropyranyl, R$^7$ and R$^8$ are identical or different and are $C_1$–$C_4$ alkyl or phenyl and R$^9$ is $C_1$–$C_4$ alkyl, —CH$_2$CH$_2$CN or —CH$_2$CH$_2$COOAlk, (c) at least one light stabiliser from the category of the polyalkylpiperidine derivatives and (d) if desired one or more other additives customary in plastics technology, and especially those compositions in which component (b) is a photocuring agent of the formula I or II in which X is —OR$^6$ or —OSiR$^7$ (R$^8$)$_2$.

Ethylenically unsaturated compounds which can be used according to the invention are the photocurable monomers, oligomers or polymers known to those skilled in the art. Such monomers containing one or more photopolymerisable double bonds are, for example, the esters of acrylic acid or methacrylic acid, for example methyl acrylate, ethyl acrylate, n- or tert.-butyl acrylate, isooctyl acrylate, 2-ethylhexyl acrylate, phenyl acrylate, benzyl acrylate, 2-hydroxyethyl acrylate or 2-hydroxypropyl acrylate, methyl methacrylate or ethyl methacrylate, ethylene diacrylate, neopentyl diacrylate, trimethylolpropane trisacrylate, pentaerythritol tetraacrylate or pentaerythritol trisacrylate; acrylonitrile, methacrylonitrile, acrylamide, methacrylamide and N-substituted (meth)-acrylamides; vinyl esters, for example vinyl acetate, vinyl propionate, vinyl acrylate or vinyl succinate; other vinyl compounds such as vinyl ethers, styrene, alkylstyrenes, halogenostyrenes, divinylbenzene, vinylnaphthalene, N-vinylpyrrolidone, vinyl chloride or vinylidene chloride; allyl compounds, such as diallyl phthalate, diallyl maleate, triallyl isocyanurate, triallyl phosphate or ethylene glycol diallyl ether and the mixtures of such unsaturated monomers.

Photopolymerisable unsaturated oligomers or polymers are, for example, thermoplastic resins, which contain unsaturated groups such as fumarate, allyl groups or acrylate or methacrylate groups, unsaturated polyesters, unsaturated acrylic resins and isocyanate-modified or epoxide-modified acrylate oligomers and also polyester and polyether acrylate oligomers. Photopolymerisable polymers are preferably used in a mixture with photopolymerisable monomers. The compounds used as component (a) are preferably acrylic and methacrylic acid derivatives and mixtures thereof, and polyurethane acrylates and mixtures thereof with other acrylic or methacrylic acid derivatives are particularly preferred. Such polyurethane acrylate are prepared from polyols or polyether-diols by reaction with excess diisocyanate and subsequent reaction of the product with hydroxyalkyl acrylates.

The photo-initiators of the formula I or II used according to the invention as component (b) are known compounds. German Offenlegungsschrift 2,722,264 and European patent application No. 788,200 31.1 describe such compounds, their preparation and their use as photo-initiators.

Examples of the radical Ar in formula I or II are phenyl, tolyl, xylyl, tert.-butylphenyl, isopropylphenyl, methoxy-, ethoxy- or isopropoxy-phenyl, diphenylyl, phenoxyphenyl, methylthiophenyl, tert.-butylthiophenyl, phenylthiophenyl, fluorophenyl, chlorophenyl, bromophenyl, dibromophenyl, chlorotolyl, methoxyxylyl or dichlorotolyl. Preferably, Ar is phenyl or phenyl which is monosubstituted or disubstituted by $C_1-C_4$-alkyl, alkoxy, phenoxy, alkylthio, phenylthio or halogen.

$R^1$ and $R^2$ can be, for example, hydroxyethyl, hydroxymethyl, methoxyethyl, acetoxyethyl, dimethylaminomethyl, ethoxycarbonylmethyl, methoxycarbonylethyl, cyanoethyl, allyl, methallyl, cyclopentyl, cyclohexyl or benzyl; preferably, $R^1$ and $R^2$ are alkyl, especially $C_1-C_5$-alkyl, such as methyl, ethyl, propyl, butyl, isobutyl, pentyl or isopentyl.

$R^1$ and $R^2$ together can be alkylene or oxa- or aza-alkylene, for example ethylene, trimethylene, tetramethylene, pentamethylene, 3-oxapentamethylene or 3-aza-pentamethylene.

Preferably, $R^1$ and $R^2$ are methyl, tetramethylene or pentamethylene.

$R^3$ can be branched or unbranched alkylene group, for example methylene, 1,2-ethylene, 1,2-propylene, 1,3-propylene, 1,4-butylene, 1,6-hexylene or 1,8-octylene.

The substituent X can be a tertiary amino group, for example a dialkylamino group or a cyclic amino group. Examples of such groups are the dimethylamino, dibutylamino, methyl-hexylamino, diethanolamino, di-(ethoxyethyl)-amino, piperidino, morpholino or 4-methylpiperazino group.

The substituent X can be a hydroxyl group or an ether group. The ether radical $R^6$ can be aliphatic, cycloaliphatic, araliphatic, aromatic or heterocyclic.

The substituent X can be a silyloxy group, for example trimethyl-, triphenyl-, dimethylphenyl- or diphenylmethyl-siloxy.

Preferably, X is a hydroxyl or siloxy group and particularly preferentially is a hydroxyl group.

Examples of compounds of the formula I or II are: 2-hydroxy-2-methyl-propiophenone, 2-hydroxy-2-methyl-(p-chloropropiophenone), 2-hydroxy-2-methyl-(p-methoxypropiophenone), 2-hydroxy-2-methyl-(p-methylpropiophenone), 2-hydroxy-2-methyl-(p-isopropylpropiophenone), 2-hydroxy-2-methyl-(p-phenoxypropiophenone), 2-methoxy-2-methyl-(p-fluoropropiophenone), 2-(2-cyanoethoxy)-2-methyl-propiophenone, 2-(2-chloroethoxy)-2-methyl-(p-bromopropiophenone), 2-(2-methoxyethoxy)-2-methyl-(p-phenylpropiophenone), 2-(2-hydroxyethoxy)-2-ethyl-(p-phenylthio-propiophenone), 2-(2-acetoxyethoxy)-2-propyl-propiophenone, 2-(2-butylthiomethoxy)-2-methyl-propiophenone, 2-allyloxy-2-methyl-propiophenone, 2-cyclohexyloxy-2-methyl-propiophenone, 1,4-di-($\alpha$-methyl-$\alpha$-benzyloxypropionyl)-benzene, 4,4'-di-($\alpha$-methyl-$\alpha$-phenoxypropionyl)-diphenylmethane, 2-($\alpha$-hydroxy-$\alpha$-methylpropionyl)-tetrahydronaphthalene, 2-($\alpha$-isopropoxy-$\alpha$-methylpropionyl)-indan, 2-dimethylamino-2-methyl-propiophenone, 2-(4-cyanoethyl-piperazino)-2-methyl-propiophenone, 2-(morpholino)-2-methyl-(p-phenyl-propiophenone), 2-trimethylsiloxy-2-methyl-(p-chloropropiophenone), 2-triphenylsiloxy-2-allyl-propiophenone, 1-cyclohexyl-1-(p-chlorobenzoyl)-ethanol, 2-hydroxy-2-(hydroxymethyl)-propiophenone, 2-hydroxy-2,2-di-(hydroxymethyl)-acetophenone, 2-hydroxy-2,2-di-(2-cyanoethyl)-acetophenone, 2-methoxy-2,2-di(methoxymethyl)-acetophenone, 2-trimethylsiloxy-2,2-dibenzyl-acetophenone, 1,4-di-($\alpha$-hydroxyisobutyroyl)-benzene, 2-dimethylamino-2,2-di-(2-ethoxycarbonylethyl)acetophenone, 1,4-dibenzoyl-1,4-dihydroxycyclohexane, 4,4'-bis-(1-hydroxy-1-benzoyl-ethyl)-diphenyl, 2,3-dihydroxy-2,3-dibenzoylbutane, 2-hydroxy-2-methyl-(p-methylthio-propiophenone), 2-hydroxy-2-ethyl-caprophenone, 1-benzoyl-cyclohexanol, 1-(4-chlorobenzoyl)-cyclopentanol, 2-hydroxy-2-ethyl-butyrophenone, 2-hydroxy-2-methylbutyrophenone and 2,5-dibenzoyl-2,5-dihydroxyhexane.

In certain cases it can be advantageous to use a mixture of 2 or more of the compounds of the formula I or II as the photo-initiator, for example in order to improve the solubility.

The amount of photo-initiators in the photocurable composition is 0.1 to 10% by weight. If photocuring is carried out with the exclusion of oxygen, for example under nitrogen, about 0.1–1% by weight suffices; if the reaction is carried out in air, about 2–5% by weight are required.

The polyalkylpiperidine derivatives used according to the invention as the light stabilisers comprising component (c) are monomeric, oligomeric or polymeric compounds which contain a radical of the formula

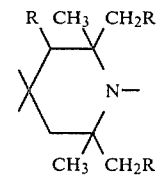

in which R is hydrogen or methyl, but preferably hydrogen. Such compounds are known light stabilisers, especially the 4-acyloxypiperidine derivatives of the type described, for example, in German Offenlegungsschrift Nos. 1,929,928 and 2,258,752 and the 4-aminopiperidine derivatives of the type described, for example, in German Offenlegungsschrift Nos. 2,040,975 and 2,349,962. These piperidine light stabilisers can also contain unsaturated groups which are photopolymerisable, for example 4-acryloxypiperidines, 4-acrylamidopiperidines or 1-(meth)acryloylpiperidines. In this case, copolymerisation of the light stabiliser with component (a) can take place during photocuring. A light stabiliser copolymerised in this way has the advantage that it is not removable by extraction or migration, so that its effect is very long-lasting. A similar effect is also achieved by the use of oligomeric or polymeric piperidine light stabilisers, such as are described, for example, in German Offenlegungsschrift No. 2,719,131 or in European Patent Publication No. 496. Furthermore, the piperidine light stabilisers can also contain sterically hindered phenol groups, as a result of which they act at the same time as an antioxidant. Such compounds are described, for example, in German Offenlegungsschrift Nos. 2,456,864 or 2,647,452.

The piperidine light stabilisers can also be used in the form of their salts with inorganic or organic acids and also in the form of their complexes with nickel compounds, such as are described in German Offenlegungsschrift 2,625,967 and in European patent application No. 78/101,303.2 now E. P. Publication No. 1840.

In certain cases, the addition of the piperidine light stabilisers can also effect acceleration of the photocuring and this is an additional advantage.

Examples of light stabilisers of the category of polyalkylpiperidine derivatives which can be used are: 4-benzoyloxy-2,2,6,6-tetramethylpiperidine, 4-stearoyloxy-2,2,6,6-tetramethylpiperidine, 4-acryloxy-2,2,6,6-tetramethylpiperidine, 4-(p-chlorobenzoyloxy)-1,2,2,6,6-pentamethylpiperidine, 4-lauroyloxy-1,2,2,6,6-pentamethylpiperidine, 4-methacryloxy-1,2,2,6,6-pentamethylpiperidine, 1-allyl-2,2,6,6-tetramethyl-4-piperidinyl salicylate, 1-(2-benzoyloxyethyl)-2,2,6,6-tetramethyl-4-piperidinyl benzoate, bis-(1,2,2,6,6-pentamethyl-4-piperidinyl) isophthalate, bis-(1,2,2,6,6-pentamethyl-4-piperidinyl) adipate, bis-(2,2,6,6-tetramethyl-4-piperidinyl) sebacate, bis-(1-acetyl-2,2,6,6-tetramethyl-4-piperidinyl) sebacate, bis-(1-hydroxyethyl-2,2,6,6-tetramethyl-4-piperidinyl) succinate, bis-(1-benzyl-2,2,6,6-tetramethyl-4-piperidinyl) sebacate, bis-(1-allyl-2,2,6,6-tetramethyl-4-piperidinyl) adipate, bis-(1,2,2,6,6-pentamethyl-4-piperidinyl) sebacate, tris(2,2,6,6-tetramethyl-4-piperidinyl) nitrilotriacetate, tris-(1-butyl-2,2,6,6-tetramethyl-4-piperidinyl) trimellitate, tris-(1-butyl-2,2,6,6-tetramethyl-4-piperidinyl) phosphate, diphenyl-bis-(2,2,6,6-tetramethylpiperidin-4-oxy)-silane, di-(1,2,2,6,6-pentamethyl-4-piperidinyl) dibutylmalonate, di-(2,2,6,6-tetramethyl-4-piperidinyl) butyl-(3,5-di-tert.-butyl-4-hydroxybenzyl)-malonate, O,O'-di-(2,2,6,6-tetramethyl-4-piperidinyl) tolylene-1,4-dicarbamate, 1-methylcarbamoyl-2,3,6-trimethyl-2,6-diethyl-4-piperidinyl methylcarbamate, 4-acetylamino-1,2,2,6,6-pentamethylpiperidine, N,N'-bis-(2,2,6,6-tetramethyl-4-piperidinyl)-hexamethylene-1,6-diamine, N,N'-bis(2,2,6,6-tetramethyl-4-piperidinyl)-N,N'-dibutyl-adipamide, 1-benzyl-2,2,6,6-tetramethyl-4-diethanolaminopiperidine, 4-acrylamido-1,2,2,6,6-pentamethylpiperidine, 9-aza-8,8,10,10-tetramethyl-1,5-dioxaspiro[5.5]undecane, 9-aza-3-ethyl-3-acetoxymethyl-9-acetyl-8,8,10,10-tetramethyl-1,5-dioxaspiro[ 5.5]undecane, 1,3,8-triaza-3,7,7,9,9-pentamethylspiro[4.5]decane-2,4-dione, 3-n-octyl-1,3,8-triaza-7,7,9,9-tetramethylspiro[4.5]decane-2,4-dione, 2,2,4,4-tetramethyl-7-oxa-3,20-diaza-21-oxodispiro[5.1.11.2]heneicosane, 1,3-di-(2,2,6,6-tetramethyl-4-piperidinyl)-imidazolidin-2-one, 2,4-diphenoxy-6-(2,2,6,6-tetramethyl-4-piperidinoxy)-s-triazine, 2,4,6-tri-[N-(2,2,6,6-tetramethyl-4-piperidinyl)-butylamino]-s-triazine, 2-dibutylamino-4,6-di-[N-(1,2,2,6,6-pentamethyl-4-piperidinyl)-ethylamino]-s-triazine, 1,4-bis(2,2,6,6-tetramethyl-1-piperidino)-but-2-ene, di-[2-(2,2,6,6-tetramethyl-1-piperidino)-ethyl] adipate, n-octyl 2,2,6,6-tetramethylpiperidine-1-acetate, a polyester of succinic acid, adipic acid, sebacic acid, dibutylmalonic acid, oxalic acid or isophthalic acid and 1-hydroxyethyl-2,2,6,6-tetramethyl-4-hydroxypiperidine, a polyamide of succinic acid, adipic acid or phthalic acid and 1-(3-aminopropyl)-2,2,6,6-tetramethyl-4-aminopiperidine, a polyamide of oxalic acid or p-phenylenediacetic acid and N,N'-di-(1,2,2,6,6-pentamethyl-4-piperidinyl)-1,6-diaminohexane, tetrakis-(2,2,6,6-tetramethyl-4-piperidinyl)-1,8,11,18-tetraazaoctadecane, a polyamine of 1,2,2,6,6-pentamethyl-4-aminopiperidine and epichlorohydrin or bisphenol A diglycidyl ether, a polytriazine of 2,4-dichloro-6-N-(1,2,2,6,6-pentamethyl-4-piperidinyl)-ethylamino-s-triazine and N,N'-bis(2,2,6,6-tetramethyl-4-piperidinyl)-1,6-diaminohexane, a polytriazine, of 2,4-dichloro-6-(1,1,3,3-tetramethylbutylamino)-s-triazine and N,N'-bis-(2,2,6,6-tetramethyl-4-piperidinyl)-1,6-diaminohexane, a polymer of 1,2,2,6,6-pentamethyl-4-methacryloxypiperidine, a copolymer of 1-benzyl-2,2,6,6-tetramethyl-4-acrylamidopiperidine and N-butylacrylamide, the salt of 1 mol of $H_3PO_4$ and 1 mol of di-(1,2,2,6,6-pentamethyl-4-piperidinyl) adipate, the salt of 2 mols of bis-(3,5-di-tert.-butyl-4-hydroxybenzyl)-malonic acid and 1 mol of 2,2,6,6-tetramethyl-4-lauroyloxypiperidine, the 1:1 complex of bis-(2,2,6,6-tetramethyl-4-piperidinyl) sabacate and nickel-II acetylacetonate and the 1:2 complex of bis-(1,2,2,6,6-pentamethyl-4-piperidinyl) adipate and nickel-II acetate.

Further examples of piperidine light stabilisers which can be used according to the invention are described in European patent application No. 78 101,720.7 now E. P. Publication No. 2753.

In certain cases it can be advantageous to use a mixture of 2 or more light stabilisers from the series comprising the polyalkylpiperidine derivatives. The amount of light stabiliser in the photocurable composition is 0.02 to 5% by weight, preferably 0.5 to 2% by weight, and depends on the desired degree of stabilisation.

As component (d), the compositions can contain further additives of the type customary in plastics technology and especially of the type customary in the technology of photocurable coatings. Examples of such additives are stabilisers to increase the dark storage stability, chain transfer agents, dyes, pigments, paraffins or waxes, stabilisers to increase the stability to heat, antioxidants or flow control agents. Pigments can be present in the composition in amounts of up to 50%. The other additives, on the other hand, are used only in small amounts.

The components are mixed by the customary methods. Preferably, a liquid compound or mixture is used as component (a). In this case (b), (c), and, if desired, (d) can be mixed into component (a) by stirring. This can result in a homogeneous solution or a dispersion. In both cases, a composition forms which can be applied to solid surfaces by methods customary in coating technology, for example by spreading, dipping, spraying or rolling. The substrates can be any type of solid material, for example metal, wood, plastics, glass, ceramics, paper or textiles. Applications of particular importance are the coating of wood, for example for furniture, floors or wall elements, the coating of decorative sheets, for example printed cardboard, plastic or fibreboard sheets, and the coating of plastics, for example floor coverings or plastic imitation veneers. The compounds according to the invention are also suitable for the production of light-stable moulded compositions, in particular transparent moulded compositions, for example sheets of acrylic glass or unsaturated polyesters.

The polymerisation of the coating applied or of the moulding composition is effected by the known methods of photopolymerisation, by irradiation with light which is rich in short-wave radiation. Suitable light sources are, for example, medium pressure, high pressure and low pressure mercury lamps and also superactinic fluorescent tubes, the emission maxima of which are in the range between 250 and 400.

The necessary exposure time must be determined experimentally for each composition, using the particular layer thickness and type of radiation source. For thin layers, the exposure time—depending on the radiation source—is about 0.1 to 10 seconds. The smear resistance of the surface can first be assessed, as a measure of the curing. A more precise measure, which also gives a picture of the through-curing, is the measurement of the König pendulum hardness (DIN 33,157). The degree of curing of moulded compositions can be assessed by measuring the Barcol hardness or the Shore D hardness.

The yellowing of the coatings and moulded compositions can be measured by spectroscopic measurement of the Yellowness Index (YI) according to ASTM-D 1925/63 T or of the transmission loss at 400 nm.

The examples which follow show the use of compositions according to the invention compared with those of the prior art. In the examples parts and percentages are by weight unless indicated otherwise. The temperature is in degrees centigrade.

EXAMPLE 1

The following experiments show the yellowing of photopolymerized transparent coatings. Compositions having the following base recipe were used: 70 parts of EBECRYL 204 (polyurethane acrylate based on tolylene diisocyanate from UCB, Brussels), 27 parts of 1,6-hexanediol diacrylate and 3 parts of photo-initiator.

As indicated in Table 1, 0 or 1 or 2 parts of the following piperidine light stabilizers were mixed into this base recipe:
LS I = bis-(2,2,6,6-tetramethyl-4-piperidinyl) sebacate
LS II = 1,2,2,6,6-pentamethyl-4-methacryloxypiperidine
LS III = di-(1,2,2,6,6-pentamethyl-4-piperidinyl) butyl(3,5-di-tert.-butyl-4-hydroxybenzyl)-malonate.

The photo-initiators used were:
A = αhydroxy-p-isopropyl-isobutyrophenone (according to the invention)
B = benzil dimethyl ketal (as comparison)
C = α-diethoxy-acetophenone (as comparison)

The mixture were applied in a layer thickness of 70–80μ to sheet aluminium painted while and were exposed for 1.5 seconds in a HANOVIA laboratory apparatus. The samples were stored in the dark for 1 week and then exposed for 720 hours in a XENOTEST 150. Table 1 shows the Yellowness Index according to ASTM-D 1925/63 T immediately after photocuring, after 24 hours' storage in the dark and after various periods of exposure in the Xenotest.

It can be seen from the results that the addition of the piperidine light stabilisers quite generally effects a certain yellowing. On exposure in the Xenotest, a sharp increase in the yellowing takes place in the case of the samples without a light stabiliser. This can be reduced in the case of Initiator A by the addition of the piperidine light stabilisers; in Comparison B no reduction in the yellowing takes place.

TABLE 1

| Photo-initiator | Light stabiliser | Yellowness Index after | | | | |
|---|---|---|---|---|---|---|
| | | UV curing | 1 week's storage in the dark | Irradiation in the Xenotest 150 | | |
| | | | | 24 hours | 216 hours | 720 hours |
| A | — | 2.1 | 1.4 | 5.7 | 8.1 | 14.8 |
| | 1% of LS I | 4.6 | 4.1 | 7.0 | 9.3 | 12.7 |
| | 2% of LS I | 3.0 | 3.2 | 3.7 | 6.3 | 10.7 |
| | 1% of LS II | 2.6 | 3.2 | 4.6 | 5.1 | 8.2 |
| | 2% of LS II | 2.9 | 2.3 | 3.6 | 5.9 | 10.1 |
| | 1% of LS III | 1.9 | 1.7 | 5.0 | 6.4 | 11.0 |
| B (Comparison) | — | 5.4 | 3.2 | 11.5 | 12.3 | 18.2 |
| | 1% of LS I | 7.8 | 3.5 | 11.4 | 13.3 | 17.6 |
| | 2% of LS I | 6.3 | 4.3 | 12.0 | 15.2 | 19.8 |
| C (Comparison) | — | 2.3 | 4.2 | 5.3 | 5.8 | 10.2 |
| | 1% of LS I | 3.4 | 12.3 | 3.7 | 6.0 | 9.6 |
| | 2% of LS I | 6.7 | 15.2 | 5.3 | 7.3 | 12.1 |
| | 1% of LS II | 3.0 | 7.4 | 5.7 | 6.8 | 10.8 |
| | 1% of LS III | 2.4 | 4.2 | 4.4 | 5.6 | 9.1 |

EXAMPLE 2

The following experiments show the influence of the light stabilisers used on the rate of photopolymerisation, measured by the pendulum hardness of the polymerised film after a specific exposure time.

The base recipe used is the same as that in Example 1. The photo-initiator used was α-hydroxyisobutyrophenone.

The light stabilisers used were: piperidine derivatives according to the invention:
LS I = bis-(2,2,6,6-tetramethyl-4-piperidinyl)sebacate
LS IV = bis-(1,2,2,6,6-pentamethyl-4-piperidinyl)sebacate
UV absorbers as comparison:
UV I = 2-hydroxy-4-dodecyloxy-benzophenone
UV II = 2-[2'-hydroxy-3',5'-di-tert.-amyl-phenyl]-benztriazole.

The experiments were carried out as described in Example 1. After exposure in the HANOVIA apparatu, the samples were stored for 30 minutes and the pendulum hardness was then measured.

TABLE 2

| % by weight of light stabiliser | Konig pendulum hardness (seconds) after an exposure time of 1.5 seconds |
|---|---|
| 0 | 57 |
| 1% of LS I | 54 |
| 1% of LS IV | 55 |
| 1% of UV I | 26 |
| 1% of UV II | <10 |

EXAMPLE 3

The following series of experiments shows the influence of the light stabilisers on the yellowing of an acrylic resin before and after exposure in a Xenotest apparatus. Base recipe:

67.6 parts of Ebecryl 210 (urethane acrylate prepolymer from UCB, Brussels)

-continued

| | | |
|---|---|---|
| 9.8 parts of | butanediol 1,4-diacrylate | |
| 19.6 parts of | N-vinylpyrrolidone | |
| 3 parts of | photo-initiator | |
| 100 parts | | |

Photo-initiators used:
D α-hydroxyisobutyrophenone
E 1-benzoyl-cyclohexanol
F α-hydroxy-p-chloro-isobutyrophenone
G α-(trimethylsiloxy)-isobutyrophenone In each case, 0.1%, 0.5% and 1% of the light stabilisers LS I and LS III described in Example 1 and of LS IV=1,2,2,6,6-pentamethyl-4-acryloxypiperidine, were mixed into this base recipe.

A 0.5 mm thick rubber ring was placed as a spacer between two small glass plates (4×4 cm) and the space within the rubber ring was filled by pouring in the liquid acrylate resin. These samples were cured by irradiating for 30 minutes with 2 superactinic fluorescent tubes (Philips TL 05/20) at a distance of 20 cm.

After measuring the Yellowness Index, the samples were exposed in the Xenotest 150 for 24, 48, 76 and 500 hours in each case and the yellowing resulting after these periods was determined by measuring the Yellowness Index. The higher the Yellowness Index, the greater is the yellowing.

TABLE 3

| Photo-initiator | Light stabiliser | Yellowness Index after | | | | |
|---|---|---|---|---|---|---|
| | | 0 | 24 | 48 | 76 | 500 hours |
| D | — | 4 | 11 | 13 | 15 | 21 |
| | 0.1% of LS I | 4 | 10 | 11 | 12 | 19 |
| | 0.5% of LS I | 4 | 9 | 11 | 12 | 19 |
| | 1% of LS I | 4 | 9 | 11 | 12 | 21 |
| E | — | 3 | 19 | 22 | 25 | 31 |
| | 0.1% of LS I | 3 | 7 | 8 | 9 | 15 |
| | 0.5% of LS I | 3 | 7 | 8 | 9 | 16 |
| | 1% of LS I | 3 | 8 | 9 | 10 | 18 |
| F | — | 3 | 31 | 36 | 40 | 49 |
| | 0.1% of LS I | 3 | 28 | 31 | 33 | 48 |
| | 0.5% of LS I | 3 | 19 | 21 | 24 | 35 |
| | 1% of LS I | 4 | 19 | 21 | 19 | 24 |
| G | — | 3 | 10 | 12 | 15 | 22 |
| | 0.1% of LS I | 3 | 7 | 7 | 8 | 17 |
| | 0.5% of LS I | 4 | 7 | 8 | 9 | 18 |
| | 1% of LS I | 4 | 7 | 8 | 9 | 22 |

TABLE 4

| Photo-initiator | Light stabiliser | Yellowness Index after | | | | |
|---|---|---|---|---|---|---|
| | | 0 | 24 | 48 | 76 | 500 hours |
| D | — | 3 | 11 | 13 | 15 | 21 |
| | 0.1% of LS III | 3 | 10 | 10 | 11 | 17 |
| | 0.5% of LS III | 3 | 10 | 10 | 11 | 17 |
| | 1% of LS III | 3 | 8 | 10 | 10 | 13 |
| E | — | 3 | 19 | 22 | 25 | 31 |
| | 0.1% of LS III | 3 | 9 | 10 | 13 | 20 |
| | 0.5% of LS III | 3 | 8 | 9 | 10 | 15 |
| | 1% of LS III | 3 | 7 | 8 | 9 | 15 |
| F | — | 3 | 31 | 36 | 40 | 49 |
| | 0.1% of LS III | 2 | 29 | 32 | 33 | 46 |
| | 0.5% of LS III | 3 | 22 | 25 | 27 | 38 |
| | 1% of LS III | 3 | 23 | 25 | 27 | 38 |
| G | — | 3 | 10 | 12 | 15 | 22 |
| | 0.1% of LS III | 4 | 8 | 8 | 9 | 16 |
| | 0.5% of LS III | 4 | 9 | 9 | 10 | 18 |
| | 1% of LS III | 4 | 9 | 9 | 10 | 18 |

TABLE 5

| Photo-initiator | Light stabiliser | Yellowness Index after | | | | |
|---|---|---|---|---|---|---|
| | | 0 | 24 | 48 | 76 | 500 hours |
| D | — | 3 | 11 | 13 | 15 | 21 |
| | 0.1% of LS IV | 3 | 10 | 12 | 13 | 18 |
| | 0.5% of LS IV | 3 | 9 | 11 | 12 | 17 |
| | 1% of LS IV | 3 | 9 | 11 | 11 | 16 |
| E | — | 3 | 19 | 22 | 25 | 31 |
| | 0.1% of LS IV | 3 | 7 | 8 | 9 | 16 |
| | 0.5% of LS IV | 3 | 8 | 8 | 9 | 16 |
| | 1% of LS IV | 3 | 8 | 8 | 9 | 14 |
| F | — | 3 | 31 | 36 | 40 | 49 |
| | 0.1% of LS IV | 3 | 22 | 25 | 27 | 39 |
| | 0.5% of LS IV | 3 | 18 | 22 | 24 | 37 |
| | 1% of LS IV | 3 | 18 | 19 | 19 | 22 |
| G | — | 3 | 10 | 12 | 15 | 22 |
| | 0.1% of LS IV | 3 | 7 | 7 | 8 | 16 |
| | 0.5% of LS IV | 3 | 7 | 7 | 8 | 16 |
| | 1% of LS IV | 3 | 6 | 7 | 8 | 16 |

What is claimed is:

1. A photocurable composition consisting of (a) one or more ethylenically unsaturated, photocurable compounds, (b) at least one photo-initiator of the formula I or II

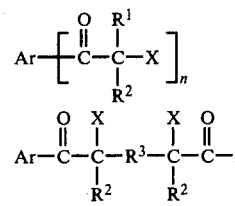

$$Ar\left[\begin{array}{c} O\ R^1 \\ \| \ | \\ -C-C-X \\ | \\ R^2 \end{array}\right]_n \qquad I$$

$$Ar-\overset{O}{\underset{\|}{C}}-\overset{X}{\underset{R^2}{C}}-R^3-\overset{X}{\underset{R^2}{C}}-\overset{O}{\underset{\|}{C}}-Ar \qquad II$$

in which n is 1 or 2 and, if n is 1, Ar is unsubstituted phenyl or phenyl substituted by one or more of the radicals F, Cl, Br, $C_1$-$C_{12}$ alkyl, -OAlk, phenyl, -Ophenyl, —SAlk, —SCH$_2$CH$_2$OH or -Sphenyl, or indanyl or tetrahydronaphthyl, and Alk is a lower alkyl radical having 1-4 C atoms, and if n is 2 Ar is $C_6$-$C_{12}$ arylene or a group -phenylene-T-phenylene-, in which T is —O—, —S—, —CH$_2$— or —CH$_2$CH$_2$—, X is one of the groups —NR$^4$R$^5$, —OR$^6$ or —OSiR$^7$(R$^8$)$_2$, R$^1$ is unsubstituted $C_1$-$C_8$ alkyl or $C_1$-$C_8$ alkyl substituted by —OH, OAlk, $C_2$-$C_8$ acyloxy, —NR$^4$R$^5$, —COOAlk or —CN, or $C_3$-$C_4$ alkenyl, $C_5$-$C_6$ cycloalkyl or $C_7$-$C_9$ phenylalkyl, R$^2$ has one of the meanings defined for R$^1$ or together with R$^1$ is $C_2$-$C_8$ alkylene or $C_3$-$C_9$ oxa- or aza-alkylene, R$^3$ is a direct bond, $C_1$-$C_6$ alkylene, $C_2$-$C_6$ oxa-alkylene, $C_2$-$C_6$ thia-, S-oxothia- or S-dioxothiaalkylene, phenylene, diphenylene or a group -phenylene-T-phenylene-, or together with the two substituents R$^2$ and the two C atoms to which these substituents are bonded forms a cyclopentane, cyclohexane, endomethylenecyclohexane or cyclohexane ring, R$^4$ is $C_1$-$C_{12}$ alkyl or $C_2$-$C_4$ alkyl which is substituted by —OH or OAlk, R$^5$ is $C_1$-$C_{12}$ alkyl or $C_2$-$C_4$ alkyl which is substituted by OH or OAlk, or together with R$^4$ is $C_4$-$C_5$ alkylene, which can be interrupted by —O— or —NR$^9$—, R$^6$ is hydrogen, $C_1$-$C_{12}$ alkyl, $C_1$-$C_8$ alkyl substituted by Cl, Br, OH, OAlk, SAlk, $C_2$-$C_8$ acyloxy, —COOAlk, —CONHAlk, —CON(Alk)$_2$ or CN, or $C_3$-$C_5$ alkenyl, cyclohexyl, benzyl, unsubstituted phenyl or phenyl substituted by Cl or Alk, or 2-tetrahydropyranyl, R$^7$ and R$^8$ are identical or different and are $C_1$-$C_4$ alkyl or phenyl and R$^9$ is $C_1$-$C_4$ alkyl, —CH$_2$CH$_2$CN or —CH$_2$CH$_2$COOAlk, and (c) at least one light stabiliser from the category of the polyalkylpiperidine derivatives.

2. A composition according to claim 1, wherein component (b) is a photocuring agent of the formula I or II in which n is 1 or 2, X is —OR$^6$ or —OSiR$^7$(R$^8$)$_2$ and Ar, R$^1$, R$^2$, R$^3$, R$^6$, R$^7$ and R$^8$ are as defined in claim 1.

3. A composition according to claim 1, wherein component (b) is a photocuring agent of the formula I or II in which n is 1, X is a hydroxyl group, Ar is an unsubstituted phenyl radical or a phenyl radical monosubstituted or disubstituted by C$_1$–C$_4$ alkyl, C$_1$–C$_4$-alkoxy, phenoxy, C$_1$–C$_4$-alkylthio, phenylthio or halogen, and R$^1$ and R$^2$ independently of one another are C$_1$–C$_5$-alkyl, or R$^1$ and R$^2$ together are tetramethylene or pentamethylene, and R$^3$ is a direct bond or C$_1$–C$_8$-alkylene.

4. A composition according to claim 1, consisting of (a) one or more photopolymerisable compounds of the series comprising the acrylic and methacrylic acid derivatives, (b) a photo-initiator of the formula I, in which n=1, X is —OH or —OSi(CH$_3$)$_3$, Ar is phenyl, alkylphenyl, alkoxyphenyl or chlorophenyl and R$^1$ and R$^2$ are methyl, or R$^1$ and R$^2$ together are tetramethylene or pentamethylene, and (c) a light stabiliser from the category of the polyalkylpiperidines.

5. A composition according to claim 4, wherein the light stabiliser (c) is an acrylic or methacrylic acid derivative of a polyalkylpiperidine.

6. A composition according to claim 4, wherein component (a) is a polyurethane acrylate or a mixture thereof with other acrylic or methacrylic acid derivatives.

7. A composition according to claim 1, which contains 0.1 to 10% by weight of component (b).

8. A composition according to claim 1, which contains 0.02 to 5% by weight of component (c).

* * * * *